US011562889B2

(12) United States Patent
Uda et al.

(10) Patent No.: US 11,562,889 B2
(45) Date of Patent: Jan. 24, 2023

(54) PLASMA PROCESSING APPARATUS AND GAS INTRODUCING METHOD

(71) Applicant: TOKYO ELECTRON LIMITED, Tokyo (JP)

(72) Inventors: Mayo Uda, Miyagi (JP); Manabu Tsuruta, Miyagi (JP); Keigo Toyoda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 112 days.

(21) Appl. No.: 17/105,938

(22) Filed: Nov. 27, 2020

(65) Prior Publication Data

US 2021/0166918 A1 Jun. 3, 2021

(30) Foreign Application Priority Data

Nov. 28, 2019 (JP) .............................. JP2019-215263

(51) Int. Cl.
*H01J 37/32* (2006.01)
*H01J 37/20* (2006.01)

(52) U.S. Cl.
CPC ........ *H01J 37/32449* (2013.01); *H01J 37/20* (2013.01); *H01J 37/32082* (2013.01); *H01J 2237/006* (2013.01)

(58) Field of Classification Search
CPC ........... H01J 37/32082; H01J 37/32449; H01J 37/32633; H01J 37/32816; H01J 37/32935

See application file for complete search history.

(56) References Cited

U.S. PATENT DOCUMENTS

| 5,134,965 A * | 8/1992 | Tokuda ............. H01J 37/32192 204/298.31 |
| 10,727,089 B2 * | 7/2020 | Caron ................ H01L 21/3065 |
| 2003/0056900 A1 * | 3/2003 | Li ..................... C23C 16/45512 156/345.33 |
| 2003/0111181 A1 * | 6/2003 | Wang .................... H01J 37/321 118/723 AN |
| 2011/0039355 A1 * | 2/2011 | Zhao ................... H01J 37/3244 257/E21.528 |
| 2020/0135433 A1 * | 4/2020 | Kim .................. H01J 37/32816 |

FOREIGN PATENT DOCUMENTS

JP 2019-067503 A 4/2019

* cited by examiner

*Primary Examiner* — Tung X Le
(74) *Attorney, Agent, or Firm* — Weihrouch IP

(57) ABSTRACT

A plasma processing apparatus includes a chamber having a sidewall and a plasma processing space surrounded by the sidewall, and a first side gas inlet line and a second side gas inlet line configured to introduce at least one gas from the sidewall into the plasma processing space. The first side gas inlet line includes a plurality of first side gas injectors symmetrically arranged along a circumferential direction on the sidewall and configured to introduce the gas in a first direction into the plasma processing space. Further, the second side gas inlet line includes a plurality of second side gas injectors symmetrically arranged along the circumferential direction on the sidewall and configured to introduce the gas in a second direction different from the first direction into the plasma processing space.

12 Claims, 13 Drawing Sheets

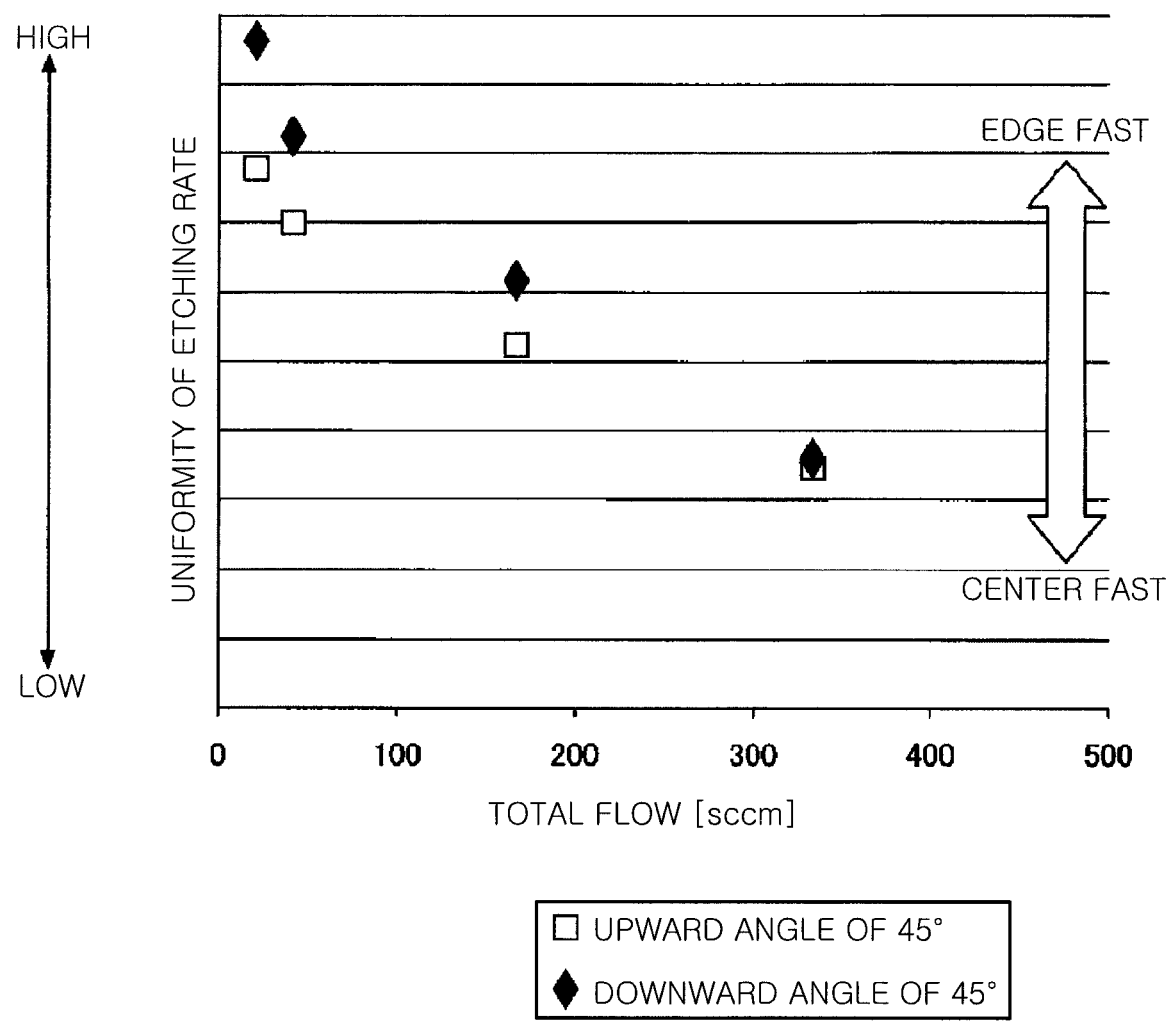

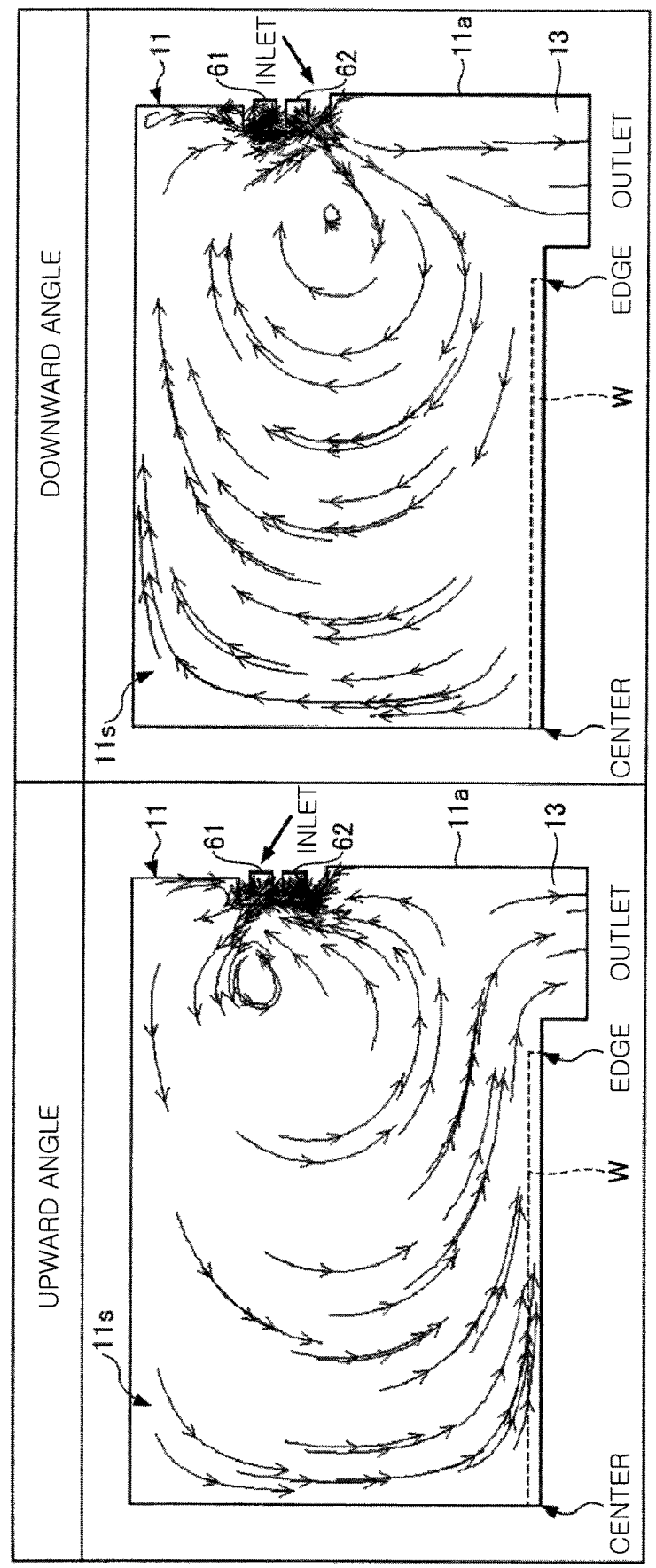

PLASMA PROCESSING APPARATUS AND GAS INTRODUCING METHOD

CROSS-REFERENCE TO RELATED APPLICATIONS

This application claims priority to Japanese Patent Application No. 2019-215263, filed on Nov. 28, 2019, the entire contents of which are incorporated herein by reference.

TECHNICAL FIELD

The present disclosure relates to a plasma processing apparatus and a gas introducing method.

BACKGROUND

For example, Japanese Patent Application Publication No. 2019-67503 discloses a plasma processing apparatus including a dielectric window forming an upper portion of a chamber, a gas supply unit for supplying a gas into the chamber from the upper portion of the chamber, an antenna disposed above the chamber to surround the gas supply unit and configured to generate plasma of the gas in the chamber by supplying a radio frequency power into the chamber, and a power supply unit for supplying a radio frequency power to the antenna.

A flow channel through which the gas to be supplied to the chamber circulates is formed in the gas supply unit. A protruding portion, which is a lower portion of the gas supply unit and protrudes into the chamber from a bottom surface of a dielectric window, has a first injection port for injecting the gas in a downward direction and a second injection port for injecting the gas in a horizontal direction or in an obliquely downward direction.

SUMMARY

The present disclosure provides a plasma processing apparatus and a gas introducing method capable of introducing a gas from a sidewall of a chamber into a plasma processing space at different angles.

In accordance with an aspect of the present disclosure, there is provided a plasma processing apparatus including: a chamber having a sidewall and a plasma processing space surrounded by the sidewall; and a first side gas inlet line and a second side gas inlet line configured to introduce at least one gas from the sidewall into the plasma processing space. Further, the first side gas inlet line includes a plurality of first side gas injectors symmetrically arranged along a circumferential direction on the sidewall and configured to introduce the gas in a first direction into the plasma processing space, and the second side gas inlet line includes a plurality of second side gas injectors symmetrically arranged along the circumferential direction on the sidewall and configured to introduce the gas in a second direction different from the first direction into the plasma processing space.

BRIEF DESCRIPTION OF THE DRAWINGS

The objects and features of the present disclosure will become apparent from the following description of embodiments, given in conjunction with the accompanying drawings, in which:

FIG. 6 shows a correlation between a total flow and an etching rate according to one embodiment;

FIGS. 7A and 7B show gas flows in a plasma processing space with respect to a gas inlet angle according to one embodiment;

DETAILED DESCRIPTION

Figure 1:
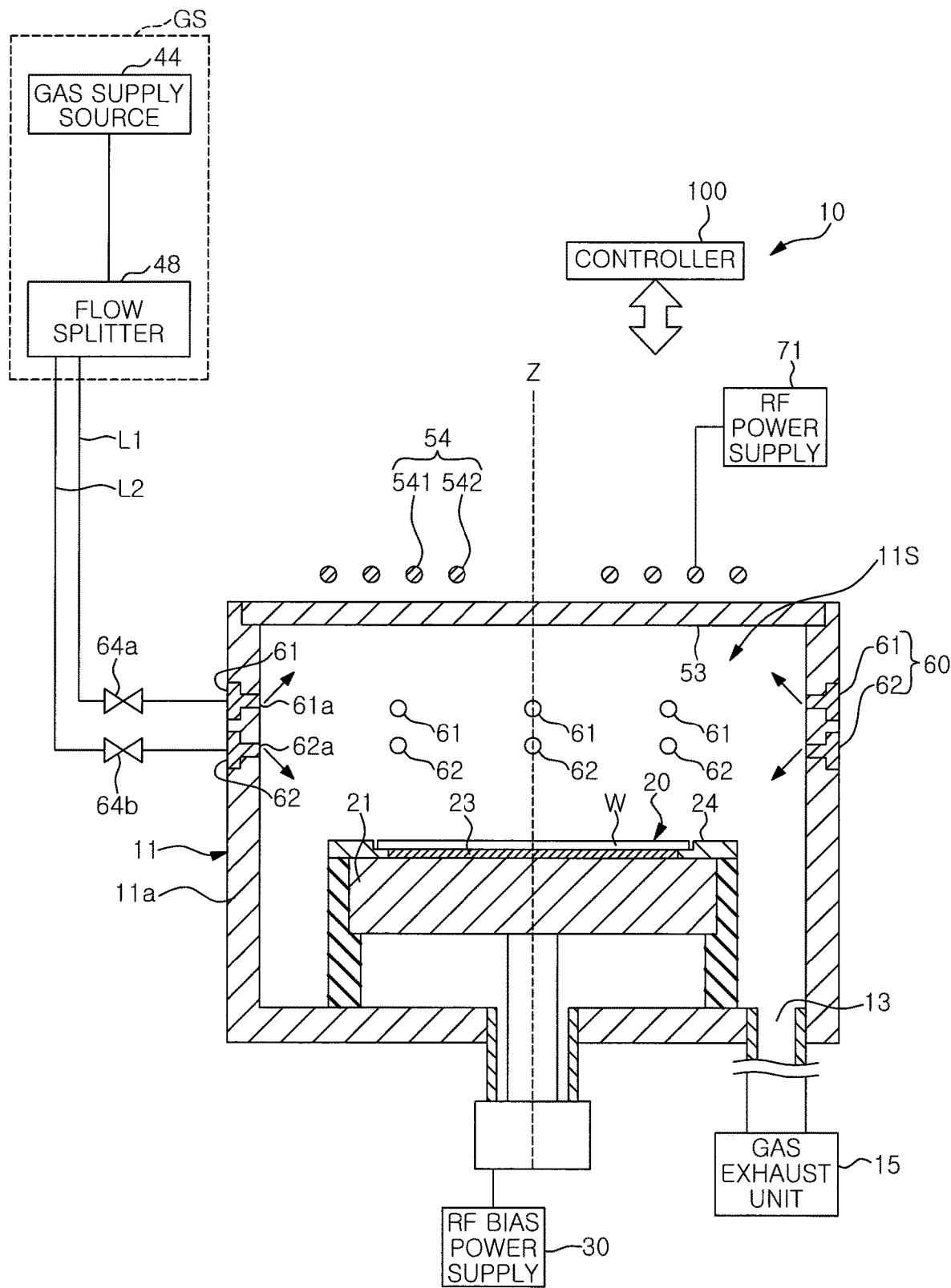
FIG. 1 is a schematic cross-sectional view of a plasma processing apparatus according to a first embodiment.

Hereinafter, embodiments will be described in detail with reference to the accompanying drawings. Like reference numerals will be given to like parts throughout the drawings, and redundant description thereof will be omitted.

First Embodiment (Plasma Processing Apparatus)

First, a plasma processing apparatus 10 according to a first embodiment will be described with reference to FIG. 1. FIG. 1 is a schematic cross-sectional view of the plasma processing apparatus 10 according to the first embodiment. The plasma processing apparatus 10 includes a chamber 11. The chamber 11 has a sidewall 11a and a plasma processing space 11s surrounded by the sidewall 11a and a dielectric window 53.

The plasma processing apparatus 10 includes a substrate support 20. The substrate support 20 is disposed in the plasma processing space 11s and is configured to support a substrate W (e.g., a wafer). The substrate support 20 has a lower electrode 21. The lower electrode 21 serves as a bias electrode. The central axis of the substrate support 20 is defined as the Z-axis.

A radio frequency (RF) bias power supply 30 is connected to the lower electrode 21. The RF bias power supply 30 is configured to supply a RF bias power having, for example, a frequency of 13 MHz to the lower electrode 21. The frequency and the power of the RF bias power are controlled by a controller 100.

The substrate support 20 includes an electrostatic chuck 23 for attracting and holding the substrate W by electrostatic attractive force. The substrate support 20 includes an edge ring 24 disposed on an upper surface of a peripheral portion of the lower electrode 21 to surround the substrate W.

Although it is not illustrated, in one embodiment, the substrate support 20 may include a temperature control module configured to adjust at least one of the electrostatic chuck 23 and the substrate W to a target temperature. The temperature control module may include a heater, a flow channel, or a combination thereof. A temperature control fluid such as a coolant or a heat transfer gas flows through the flow channel. The temperature control module is controlled by the controller 100.

A gas exhaust port 13 is formed at a bottom surface of the chamber 11 and is connected to a gas exhaust unit 15. The plasma processing space 11s is exhausted by the gas exhaust unit 15. The gas exhaust unit 15 is controlled by the controller 100.

The plasma processing apparatus 10 has a first side gas inlet line L1 and a second side gas inlet line L2. The first side gas inlet line L1 is configured to introduce a gas from the sidewall 11a into the plasma processing space 11s. Further, the first side gas inlet line L1 has a plurality of first side gas injectors 61 and a valve 64a.

The first side gas injectors 61 are arranged symmetrically with respect to the Z-axis along the sidewall 11a. In the embodiment, eight first side gas injectors 61 are arranged at equal intervals along the sidewall 11a (see FIG. 4A). However, the number of the first side gas injectors 61 is not limited to eight and may be any number as long as it is plural. Each of the first side gas injectors 61 is configured to introduce a gas from a first inlet port 61a into the plasma processing space 11s in a first direction.

The first direction may be an obliquely upward direction. In the embodiment, the first direction is obliquely upward at an angle of 45° with respect to the horizontal plane. However, the first direction is not limited thereto and may be any direction that is obliquely upward at an angle within a range of 0° to 90° with respect to the horizontal plane. Alternatively, the first direction is not necessarily an obliquely upward direction and may be any direction that is obliquely downward or the like, for example.

The valve 64a is opened and closed to control a supply and a shut-off of the supply of the gas introduced from the first side gas injector 61 into the plasma processing space 11s.

The second side gas inlet line L2 is configured to introduce a gas from the sidewall 11a into the plasma processing space 11s. The second side gas inlet line L2 has a plurality of second side gas injectors 62 and a valve 64b.

The second side gas injectors 62 are arranged symmetrically with respect to the Z-axis along the sidewall 11a. In the embodiment, eight second side gas injectors 62 are arranged at equal intervals along the sidewall 11a (see FIG. 4B). However, the number of the second side gas injectors 62 is not limited to eight and may be any number as long as it is plural. Each of the second side gas injectors 62 is configured to introduce a gas from a second inlet port 62a into the plasma processing space 11s in a second direction different from the first direction.

The second direction may be an obliquely downward direction. In the embodiment, the second direction is obliquely downward at an angle of 45° with respect to the horizontal plane. However, the second direction is not limited thereto and may be any direction that is different from the first direction and is obliquely downward at an angle within a range of 0° to −90° with respect to the horizontal plane. For example, the second direction may be directed toward the edge region of the substrate support 20. Alternatively, the second direction is not necessarily the obliquely downward direction and may be another direction different from the first direction.

The valve 64b is opened and closed to control a supply and a shut-off of the supply of the gas introduced from the second side gas injector 62 into the plasma processing space 11s. Hereinafter, the first side gas injector 61 and the second side gas injector 62 will be collectively referred to as "side gas injector 60."

The plasma processing apparatus 10 includes a gas supply unit GS. The gas supply unit GS has a gas supply source 44 and a flow splitter 48 in that order from an upstream side. The gas supply unit GS is in fluid communication with the first side gas inlet line L1 and the second side gas inlet line L2 to supply a gas. The flow splitter 48 is configured to control a flow ratio of the gas supplied to the first side gas inlet line L1 and the second side gas inlet line L2. The flow splitter 48 is an example of a first flow distributor configured to control the flow ratio of the gas supplied to the first side gas inlet line L1 and the second side gas inlet line L2. The first flow distributor is not limited to the flow splitter 48 and may be a switch configured to selectively introduce a gas into the first side gas inlet line L1 or the second side gas inlet line L2.

The plasma processing apparatus 10 includes an antenna for plasma generation that is disposed on or above the chamber 11 (the dielectric window 53). The antenna 54 has at least one coil. In the example of FIG. 1, the antenna 54 has an outer coil 541 and an inner coil 542. The inner coil 542 is disposed such that the central axis thereof coincides with the Z-axis. The outer coil 541 is disposed to surround the inner coil 542.

At least one of the outer coil 541 and the inner coil 542 functions as a primary coil connected to a RF power supply 71. Therefore, the RF power supply 71 is configured to supply a RF source power to at least one of the outer coil 541 and the inner coil 542. In the example of FIG. 1, the RF power supply 71 is connected to the outer coil 541, and the RF source power is supplied to the outer coil 541. A frequency of the RF source power is greater than that of the RF bias power. One of the outer coil 541 and the inner coil 542 that is not connected to the RF power supply 71 functions as a secondary coil that is inductively coupled to the primary coil. In the example of FIG. 1, the inner coil 542 is inductively coupled to the outer coil 541. The frequency and the power of the RF source power are controlled by the controller 100. The outer coil 541 and the inner coil 542 may be arranged at the same height or different heights.

The controller 100 is configured to control the individual components of the plasma processing apparatus 10. The controller 100 includes a memory such as a read only memory (ROM) or a random access memory (RAM), and a processor such as a central processing unit (CPU). The memory in the controller 100 stores data such as recipes, programs, and the like. The processor in the controller 100 reads out and executes the programs stored in the memory in the controller 100. The processor controls the individual components of the plasma processing apparatus 10 based on the data such as the recipes stored in the memory in the controller 100.

(Structure of Side Gas Injector)

Figure 2A:
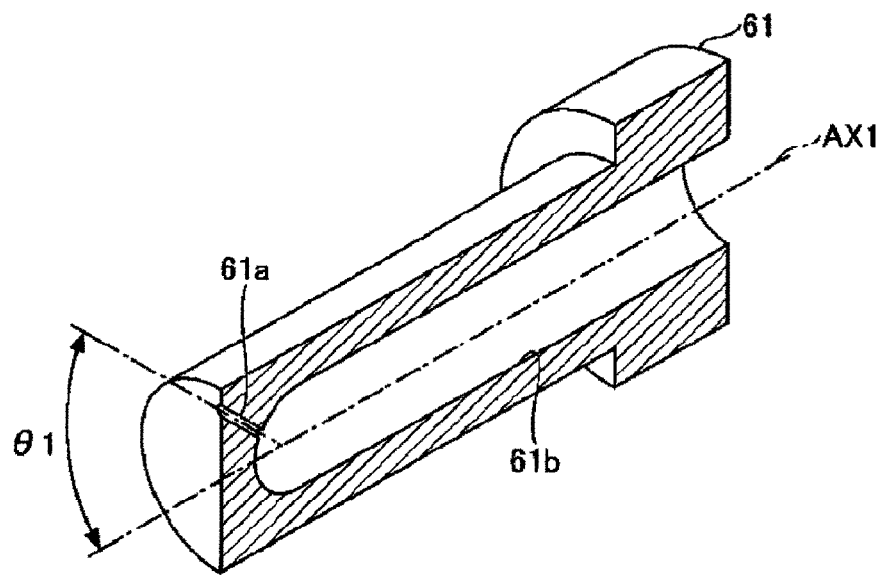
FIGS. 2A and 2B show an internal structure of a side gas injector according to one embodiment.
Figure 2B:
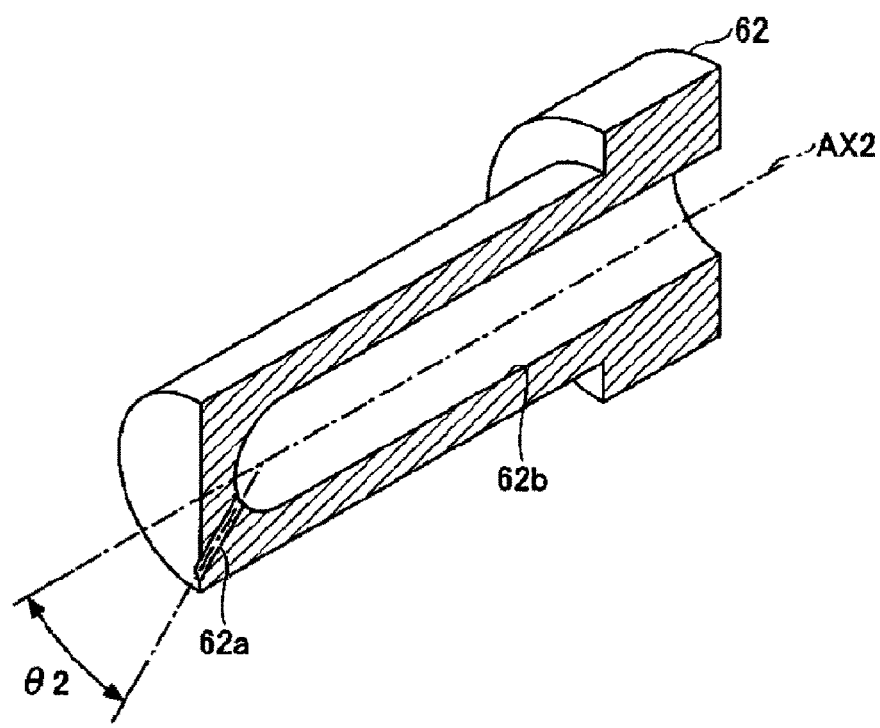

Next, a structure of the side gas injector 60 will be described with reference to FIGS. 2A and 2B. FIGS. 2A and 2B show an internal structure of the side gas injector 60 according to the embodiment. FIG. 2A is a cross-sectional view of the first side gas injector 61 taken along a plane passing coaxially along a central axis AX1 in a longitudinal direction. FIG. 2B is a cross-sectional view of the second side gas injector 62 taken along a plane passing coaxially along a central axis AX2 in a longitudinal direction.

Each of the first side gas injector 61 and the second side gas injector 62 is made of a dielectric material such as ceramic or quartz, and has a substantially cylindrical outer shape. The first side gas injector 61 has the first inlet port 61a at its tip end, and the first inlet port 61a communicates with a gas line 61b. The second side gas injector 62 has the second inlet port 62a at its tip end, and the second inlet port 62a communicates with a gas line 62b. An angle θ1 formed by the central axis AX1 and the first inlet port 61a is 45° upward with respect to the horizontal plane. An angle θ2 formed by the central axis AX2 and the second inlet port 62a is 45° downward with respect to the horizontal plane.

(Arrangement of Side Gas Injectors)

Referring back to FIG. 1, the arrangement of the side gas injector 60 will be described. The number of the first side gas injectors 61 is the same as the number of the second side gas injectors 62, and the first side gas injectors 61 are arranged at different heights from the second side gas injectors 62.

In FIG. 1, the first side gas injectors 61 are arranged at equal intervals and the second side gas injectors 62 are arranged at equal intervals along the circumferential direction on the sidewall 11a while the first side gas injectors 61 are arranged at upper positions and the second side gas injectors 62 are arranged at lower positions. The first side gas injectors 61 have an upward inlet angle of 45°, and the second side gas injectors 62 have a downward inlet angle of 45°. However, without being limited thereto, the first direction of the first side gas injectors 61 and the second direction of the second side gas injectors 62 may have any angle as long as they are different from each other. Further, either the first direction or the second direction may have an angle of 0° (horizontal angle) with respect to the horizontal plane.

Figure 3A:
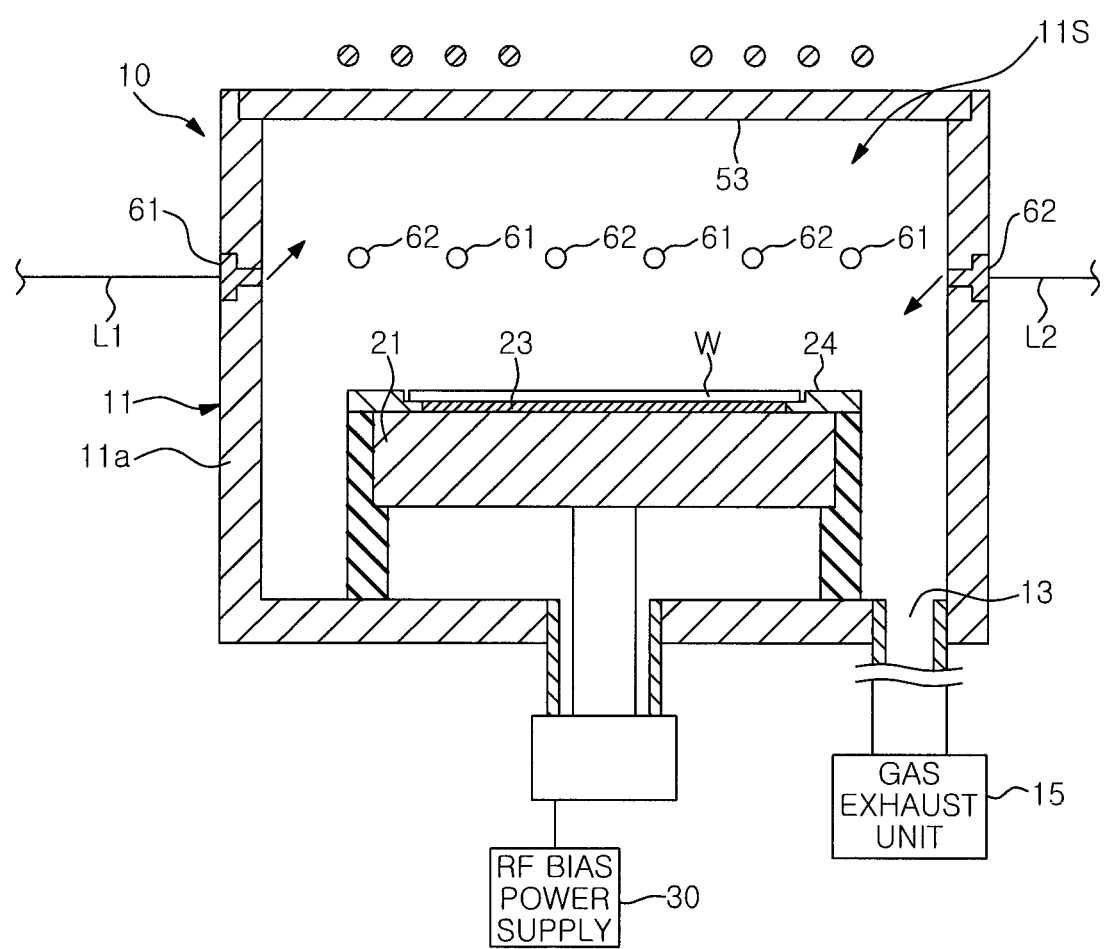
FIGS. 3A and 3B are schematic cross-sectional views of different examples of an arrangement of the side gas injector according to one embodiment.
Figure 3B:
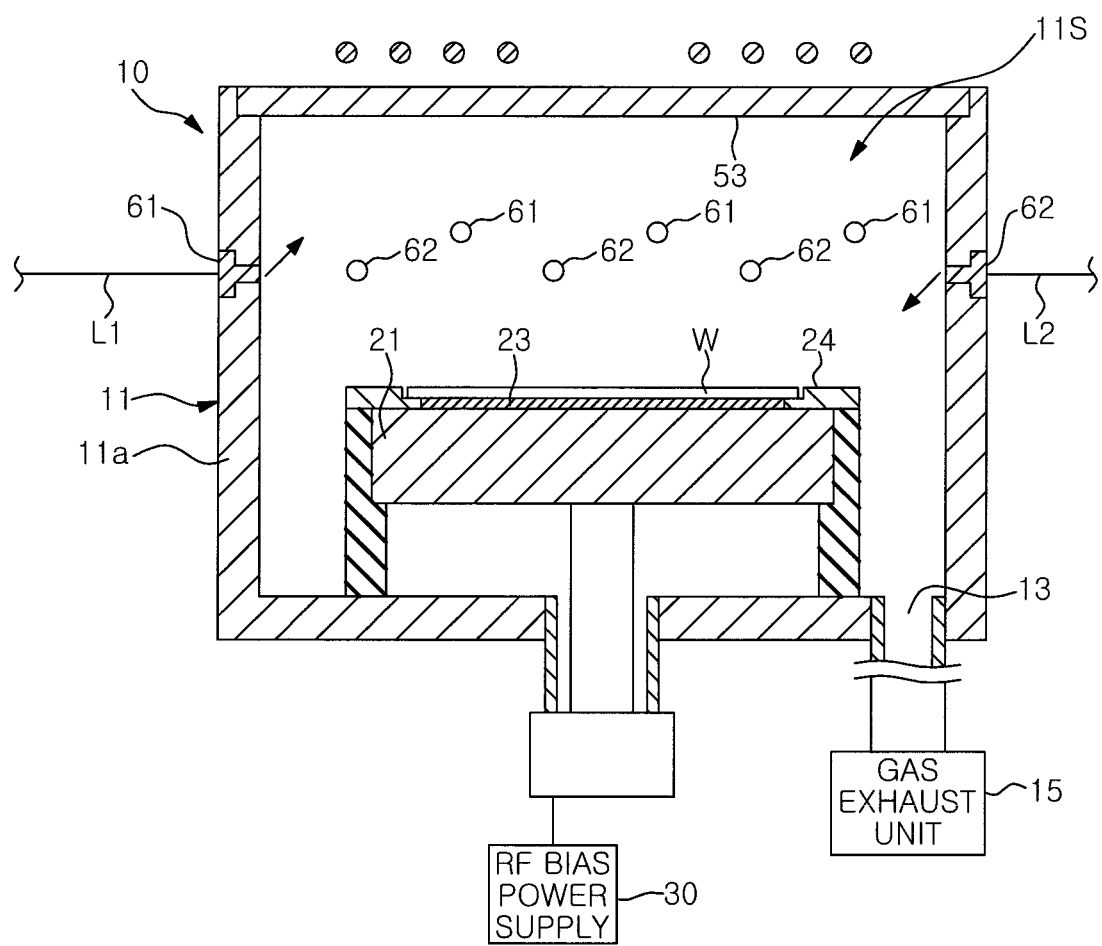

FIGS. 3A and 3B are schematic cross-sectional views showing different examples of an arrangement of the side gas injector according to the embodiment. In the plasma processing apparatus 10 shown in FIG. 3A, the number of the first side gas injectors 61 is the same as the number of the second side gas injectors 62. In the example of FIG. 3A, the first side gas injectors 61 and the second side gas injectors 62 are alternately arranged at the same height. Further, the first side gas injectors 61 and the second side gas injectors 62 adjacent to each other are spaced apart from each other at regular intervals. However, the present disclosure is not limited thereto.

Further, the first side gas injectors 61 and the second side gas injectors 62 have different inlet angles. That is, the first side gas injectors 61 have an upward inlet angle, and the second side gas injectors 62 have a downward inlet angle. The first direction of the first side gas injectors 61 and the second direction of the second side gas injectors 62 may be any direction as long as they are different from each other. Further, either the first direction or the second direction may have an angle of 0° with respect to the horizontal plane.

In the plasma processing apparatus 10 shown in FIG. 3B, the number of the first side gas injectors 61 is the same as the number of the second side gas injectors 62. In the example of FIG. 3B, the first side gas injectors 61 and the second side gas injectors 62 are arranged alternately at different heights along the circumferential direction on the sidewall 11a. Further, the first side gas injectors 61 and the second side gas injectors 62 adjacent to each other are spaced apart from each other at regular intervals. However, the present disclosure is not limited thereto.

Further, the first side gas injectors 61 and the second side gas injectors 62 have different inlet angles. That is, the first side gas injectors 61 have an upward inlet angle, and the second side gas injectors 62 have a downward inlet angle.

The first direction of the first side gas injectors 61 and the second direction of the second side gas injectors 62 may be any direction as long as they are different from each other. Further, either the first direction or the second direction may have an angle of 0° with respect to the horizontal plane.

(Tournament Structures of Side Gas Inlet Lines)

Figure 4A:
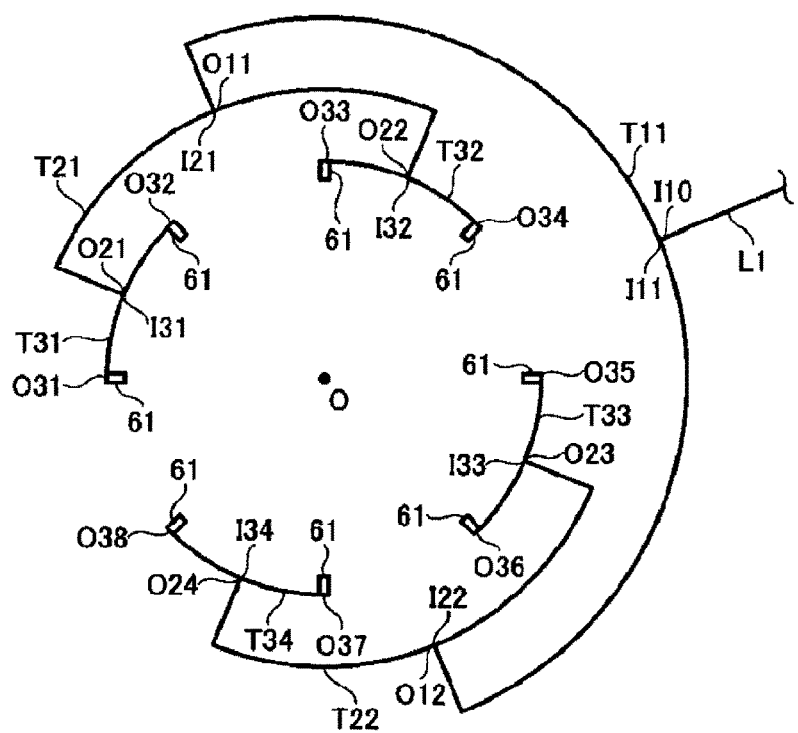
FIGS. 4A and 4B show tournament structures of side gas inlet lines according to one embodiment.
Figure 4B:
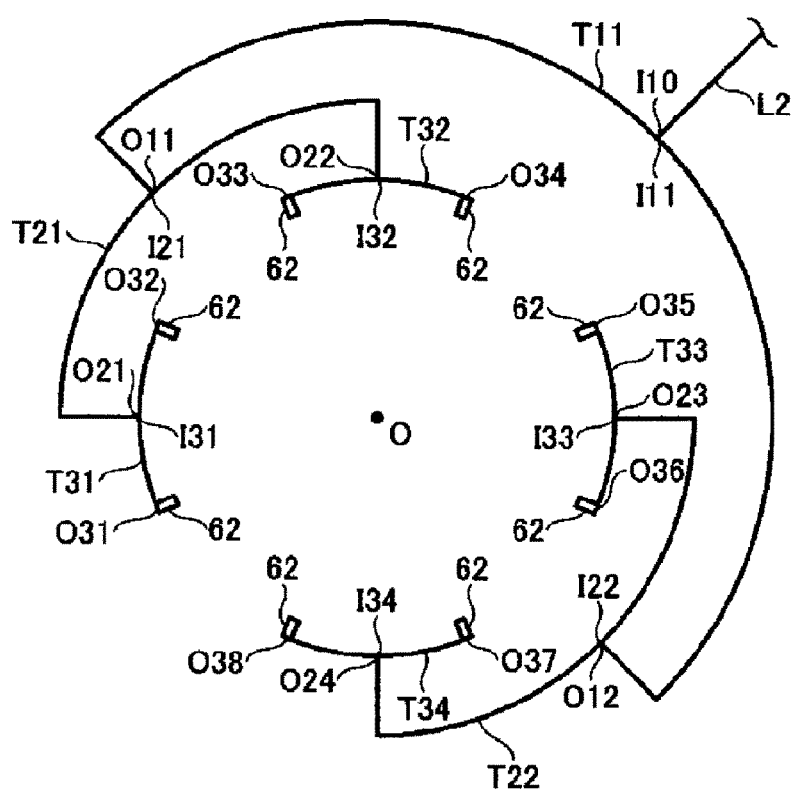

Next, tournament structures of the side gas inlet lines L1 and L2 will be described with reference to FIGS. 4A and 4B. FIGS. 4A and 4B are plan views of the side gas injector 60 that show the tournament structures of the side gas inlet lines L1 and L2 according to the embodiment.

FIG. 4A shows the tournament structure of the side gas inlet line L1 connected to the first side gas injectors 61. The tournament structure of the side gas inlet line L2 has the same branch structure as that of the tournament structure of the side gas inlet L1. The tournament structure of the side gas inlet line L2 is disposed vertically below the tournament structure of the side gas inlet line L1.

Hereinafter, the tournament structure of the side gas inlet line L1 will be described with reference to FIG. 4A, and the description of the tournament structure of the side gas inlet L2 having the same structure will be omitted.

The first side gas inlet line L1 has a plurality of bifurcated branch lines. The bifurcated branch lines include a first bifurcated branch line T11, two second bifurcated branch lines T21 and T22, and four third bifurcated branch lines T31, T32, T33, and T34.

The first bifurcated branch line T11 includes one inlet I11 and two outlets O11 and O12. The inlet I11 of the first bifurcated branch line T11 is connected to an inlet 110 of the first side gas inlet line L1.

The two second bifurcated branch lines T21 and T22 include two inlets I21 and I22 and four outlets O21, O22, O23, and O24. The two inlets I21 and I22 of the two second bifurcated branch lines T21 and T22 are connected to the two outlets O11 and O12 of the first bifurcated branch line, respectively.

The four third bifurcated branch lines T31, T32, T33 and T34 include four inlets I31, I32, I33, and I34 and eight outlets O31, O32, O33, O34, O35, O36, O37, and O38. The four inlets I31 to I34 of the four third bifurcated branch lines T31 to T34 are connected to the four outlets O21 to O24 of the two second bifurcated branch lines T21 and T22, respectively.

The eight outlets O31 to O38 of the four third bifurcated branch lines T31 to T34 are connected to the eight first side gas injectors 61, respectively.

The distances from one inlet of the first bifurcated branch line T11 to the eight outlets of the four third bifurcated branch lines T31 to T34 are the same.

In the plasma processing apparatus 10 shown in FIG. 3A, the tournament structure of the second side gas injectors 62 is misaligned with the tournament structure of the first side gas injectors 61 shown in FIG. 4A, as can be seen from FIG. 4B. Accordingly, the second side gas injectors 62 and the first side gas injectors 61 are alternately arranged at the same height and misaligned by 22.5° in the circumferential direction.

As described above, the first side gas injectors 61 and the second side gas injectors 62 have the tournament structure for evenly distributing the gas to the plasma processing space 11s.

(Gas Introducing Method Used in Plasma Processing Apparatus)

Next, a gas introducing method used in the plasma processing apparatus 10 including the chamber 11 having the sidewall 11a and the plasma processing space 11s surrounded by the sidewall 11a, the first side gas inlet line L1, and the second side gas inlet line L2 will be described.

The first side gas inlet line L1 has the first side gas injectors 61 symmetrically arranged along the circumferential direction on the sidewall 11a. The second side gas inlet line L2 has the second side gas injectors 62 symmetrically arranged along the circumferential direction on the sidewall 11a.

The gas introducing method has the following steps (a) to (c).

(a) The amount of gas supplied to the first side gas inlet line L1 and the amount of gas supplied to the second side gas inlet line L2 are controlled.

(b) The gas is introduced in the first direction into the plasma processing space 11s from the respective first side gas injectors 61.

(c) The gas is introduced in the second direction into the plasma processing space 11s from the respective second side gas injectors 62. The first direction is different from the second direction.

The steps (b) and (c) may be performed at the same time. In this case, the step (a) may include a control of a flow ratio of the gas supplied to the first side gas inlet line L1 and the second side gas inlet line L2 using the above-described flow splitter.

The steps (b) and (c) may be performed alternately. In this case, the step (a) may include a selective introduction of the gas into the first side gas inlet line L1 or the second side gas inlet line L2 using the above-described switch.

Further, the steps (b) and (c) may be repeated.

The following is a description on simulations and tests using the side gas injector 60 of the plasma processing apparatus 10 configured as described above.

(Simulation 1: Correlation Between Gas Inlet Angle and Pressure Distribution on Substrate)

Figure 5A:
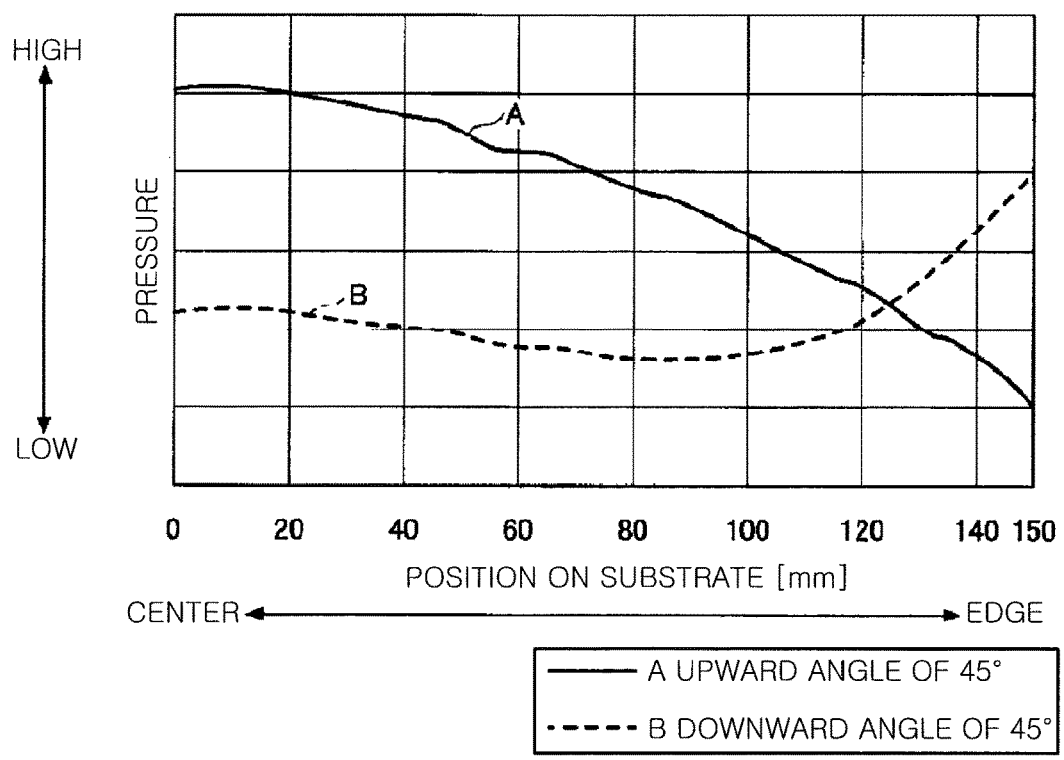
FIGS. 5A and 5B show a correlation between a gas inlet angle and a pressure distribution on a substrate according to one embodiment.
Figure 5B:
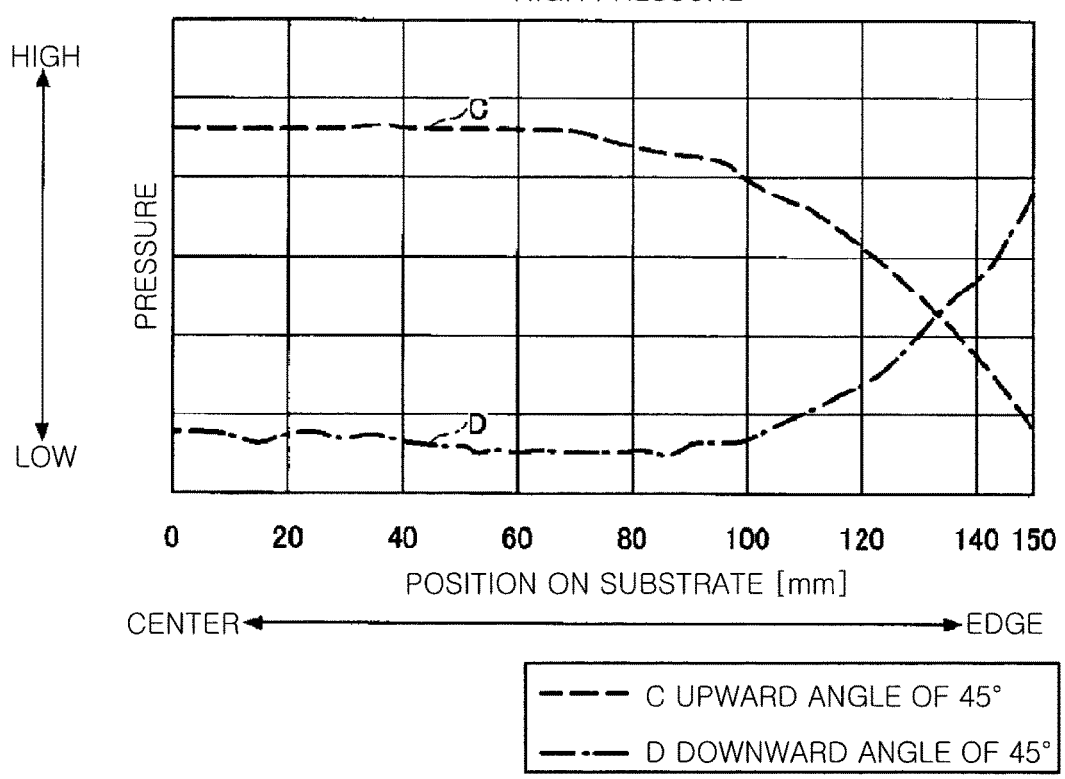

First, a result of a simulation (hereinafter, referred to as "simulation 1") of pressure distribution on a substrate in the case of changing the angle of the first side gas injectors 61 will be described with reference to FIGS. 5A and 5B. FIGS. 5A and 5B show the correlation between the gas inlet angle and the pressure distribution on the substrate according to the embodiment. The conditions of the simulation 1 are as follows:

(Simulation Conditions)

For the case of low pressure shown in FIG. 5A, the pressure in the chamber is 1.33 Pa.

For the case of high pressure shown in FIG. 5B, the pressure in the chamber is 53.33 Pa.

The side gas injector introduces $O_2$ gas of 500 sccm.

The horizontal axis in each of FIGS. 5A and 5B represents a radial position of the substrate having a diameter of 300 mm. 0 mm indicates the center of the substrate, and 150 mm indicates the edge of the substrate. The vertical axis in each of FIGS. 5A and 5B represents a pressure on the substrate at each position.

A line A in FIG. 5A and a line C in FIG. 5B indicate pressure distribution on the substrate in the case of setting the gas inlet angle of the first side gas injectors 61 to 45° upward with respect to the horizontal plane. A line B in FIG. 5A and a line D in FIG. 5B indicate pressure distribution on the substrate in the case of setting the gas inlet angle of the first side gas injectors 61 to 45° downward with respect to the horizontal plane.

In both of the case where the pressure in the chamber is low as shown in FIG. 5A and the case where the pressure in the chamber is high as shown in FIG. 5B, when the gas inlet angle of the first side gas injectors 61 is 45° upward with respect to the horizontal plane, the pressure in the edge region of the substrate W becomes lower than that in the central region of the substrate W.

Further, in both of the case where the pressure in the chamber is low and the case where the pressure in the chamber is high, when the gas inlet angle of the first side gas injectors 61 is 45° downward with respect to the horizontal plane, the pressure in the edge region of the substrate W becomes higher than that in the central region of the substrate W.

From the above, it is clear that the pressure distribution in the chamber at least in the edge region of the substrate W can be controlled by switching the first direction of the first side gas injectors 61 and/or the second direction of the second side gas injectors 62.

(Test 1: Correlation Between Total Flow and Etching Rate)

Next, a result of a test (hereinafter, referred to as "test 1") of a correlation between a gas inlet angle and an etching rate obtained in the case of using the plasma processing apparatus 10 according to the embodiment will be described with reference to FIG. 6. FIG. 6 shows the correlation between the total flow and the etching rate according to the embodiment. The conditions of the test 1 are as follows:

(Test Conditions)

For the case of "□" in FIG. 6, the gas inlet angle of the first side gas injectors 61 is set to 45° upward with respect to the horizontal plane (no gas flows from the second side gas injectors 62)

For the case of "♦" in FIG. 6, the gas inlet angle of the first side gas injectors 61 is set to 45° downward with respect to the horizontal plane (no gas flows from the second side gas injectors 62).

The horizontal axis of the graph in FIG. 6 represents the total flow of the first side gas injectors 61 at each of the upward gas inlet angle of 45° and the downward gas inlet angle of 45°, and the vertical axis represents the uniformity of the etching rate.

According to the result of the test 1, when the total flow is about 200 sccm or less, the etching rate tends to be improved in the edge region of the substrate W in the case of setting the gas inlet angle of the first side gas injectors 61 to 45° downward ("|" in FIG. 6). In FIG. 6, this tendency is expressed as "Edge Fast." Further, in the case of setting the gas inlet angle of the first side gas injectors 61 to 45° upward ("□" in FIG. 6), the etching rate tends to be improved in the central region of the substrate W. In FIG. 6, this tendency is expressed as "Center Fast."

From the above, it is clear that when the total flow is 200 sccm or less, the uniformity of the etching rate becomes higher in the case of setting the gas inlet angle to 45° downward than in the case of setting the gas inlet angle to 45° upward. It is also clear that when the total flow is 300 sccm or more, whether the gas inlet angle is set to 45° upward or to 45° downward has little influence on the uniformity of the etching rate.

(Simulation 2: Gas Inlet Angle and Gas Flow in Plasma Processing Space)

Next, a result of a simulation (hereinafter, referred to as "simulation 2") of a gas flow in the plasma processing space in the case of introducing the gas from the first side gas injectors 61 or in the case of introducing the gas from the second side gas injectors 62 will be described with reference to FIGS. 7A and 7B. FIGS. 7A and 7B show the gas flows in the plasma processing space 11s with the gas inlet angle according to the embodiment. The conditions of the simulation 2 are as follows:

(Simulation Conditions)

A pressure in the chamber is 400 mT (53.3 Pa)

The side gas injector introduces Ar gas of 500 sccm

For the case of FIG. 7A, the gas inlet angle of the first side gas injectors 61 is set to 45° upward with respect to the horizontal plane (no gas flows from the second side gas injectors 62).

For the case of FIG. 7B, the gas inlet angle of the second side gas injectors 62 is set to 45° downward with respect to the horizontal plane (no gas flows from the first side gas injectors 61).

In FIGS. 7A and 7B, the gas flow in the plasma processing space 11s on the right side of the Z-axis (see FIG. 1) is indicated by arrows.

As shown in FIG. 7A, when the gas is injected toward a ceiling wall while setting the gas inlet angle to 45° upward, a gas flow directed from the central side of the substrate W toward the edge of the substrate W and further toward the gas exhaust port 13 is formed. In this case, the gas flow that allows an effective discharge of reaction by-products on the substrate W generated during the etching is formed.

On the contrary, as shown in FIG. 7B, when the gas is injected toward the edge of the substrate W or toward the edge ring 24 while setting the gas inlet angle to 45° downward, a gas flow directed from the edge side of the substrate W toward the central side of the substrate W is formed. In this case, the gas flow that hinders the discharge of the reaction by-products on the substrate W is formed.

From the above, it is clear that the discharge of the reaction by-products on the substrate W can be controlled by switching the gas inlet angles of the first side gas injectors 61 and the second side gas injectors 62. For example, when it is desired to effectively discharge the reaction by-products or the gas on the substrate W, the first side gas injectors 61 are controlled to have the upward gas inlet angle. When it is desired to make the gas stay on the substrate W, the second side gas injectors 62 are controlled to have the downward gas inlet angle.

When the gas inlet angle is upward as shown in FIG. 7A, it is preferable to set the gas inlet angle toward any surface on the ceiling wall. When the gas inlet angle is downward as shown in FIG. 7B, it is preferable to set the gas inlet angle toward the edge of the substrate W or the edge ring 24.

Second Embodiment (Plasma Processing Apparatus)

Figure 8:
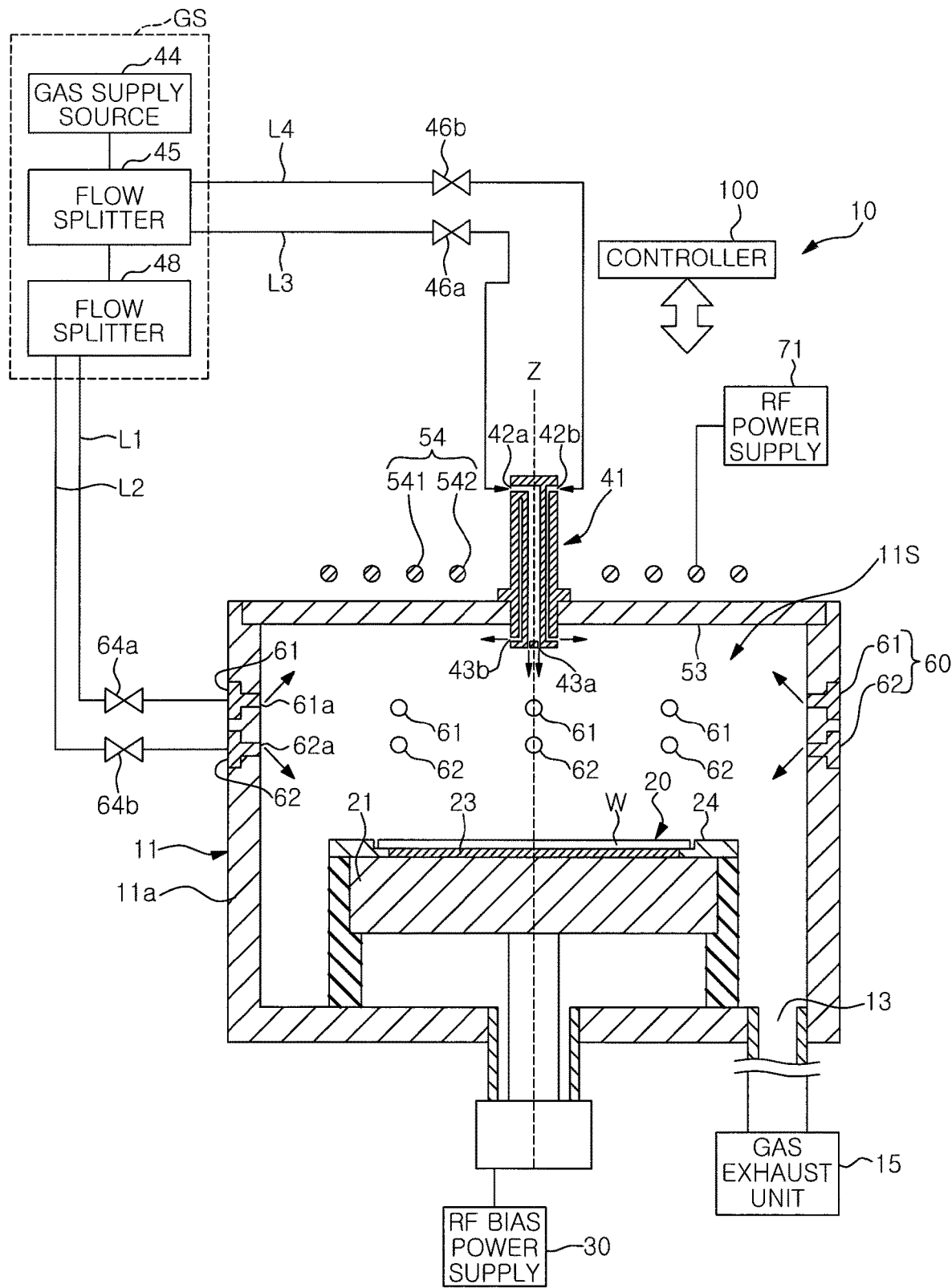
FIG. 8 is a schematic cross-sectional view of a plasma processing apparatus according to a second embodiment.

Next, a plasma processing apparatus 10 according to a second embodiment will be described with reference to FIG. 8. FIG. 8 is a schematic cross-sectional view of the plasma processing apparatus 10 according to the second embodiment. The plasma processing apparatus 10 according to the second embodiment is different from the plasma processing apparatus (see FIG. 1) according to the first embodiment in that it includes a center gas injector 41 connected to the gas supply unit GS through a first center gas inlet line L3 and a second center gas inlet line L4. Other configurations of the plasma processing apparatus 10 according to the second embodiment are the same as those of the plasma processing apparatus 10 according to the first embodiment. Therefore, in the following description, only the different configurations will be described, and the description of the same configurations as those of the first embodiment will be omitted.

The center gas injector 41 is disposed at a center of a ceiling wall of the chamber 11. The center gas injector has a substantially cylindrical outer shape and is disposed at an opening formed at the centers of a shield box (not shown) and the dielectric window 53 such that the central axis thereof coincides with the Z-axis. The center gas injector 41 is configured to inject a gas into the plasma processing space 11s in a downward direction and a lateral direction.

The center gas injector 41 includes supply ports 42a and 42b for supplying a gas into the center gas injector 41. The supply ports 42a and 42b are disposed at an upper portion of the center gas injector 41. A lower portion of the center gas injector 41 protrudes downward beyond a bottom surface of the dielectric window 53. At the lower portion of the center gas injector 41, the center gas injector 41 includes an inlet port 43a for introducing a gas downward along the Z-axis and an inlet port 43b for introducing the gas in a lateral direction, i.e., in a direction away from the Z-axis.

The gas supply unit GS has a gas supply source 44, a flow splitter 45, and a flow splitter 48 in that order from the upstream side. The gas supply unit GS is in fluid communication with the first center gas inlet line L3 and the second center gas inlet line L4. Accordingly, the center gas injector 41 is connected to the gas supply unit GS. The flow splitter 45 is configured to control a flow ratio of a gas supplied to the first center gas inlet line L3 and the second center gas inlet line L4. Further, the flow splitter 45 is an example of a second flow distributor configured to control a flow ratio of the gas supplied to the center gas injector 41 and the flow splitter 48.

The second flow distributor is not limited to the flow splitter 45 and may be a switch configured to selectively introduce a gas into the center gas injector 41 or the flow splitter 48. The gas supply source 44 is configured to supply an etching gas such as $CF_4$ gas or chlorine gas into the chamber 11.

(Simulation 3: Combination of a Side Gas Injector and a Center Gas Injector)

Figure 9:
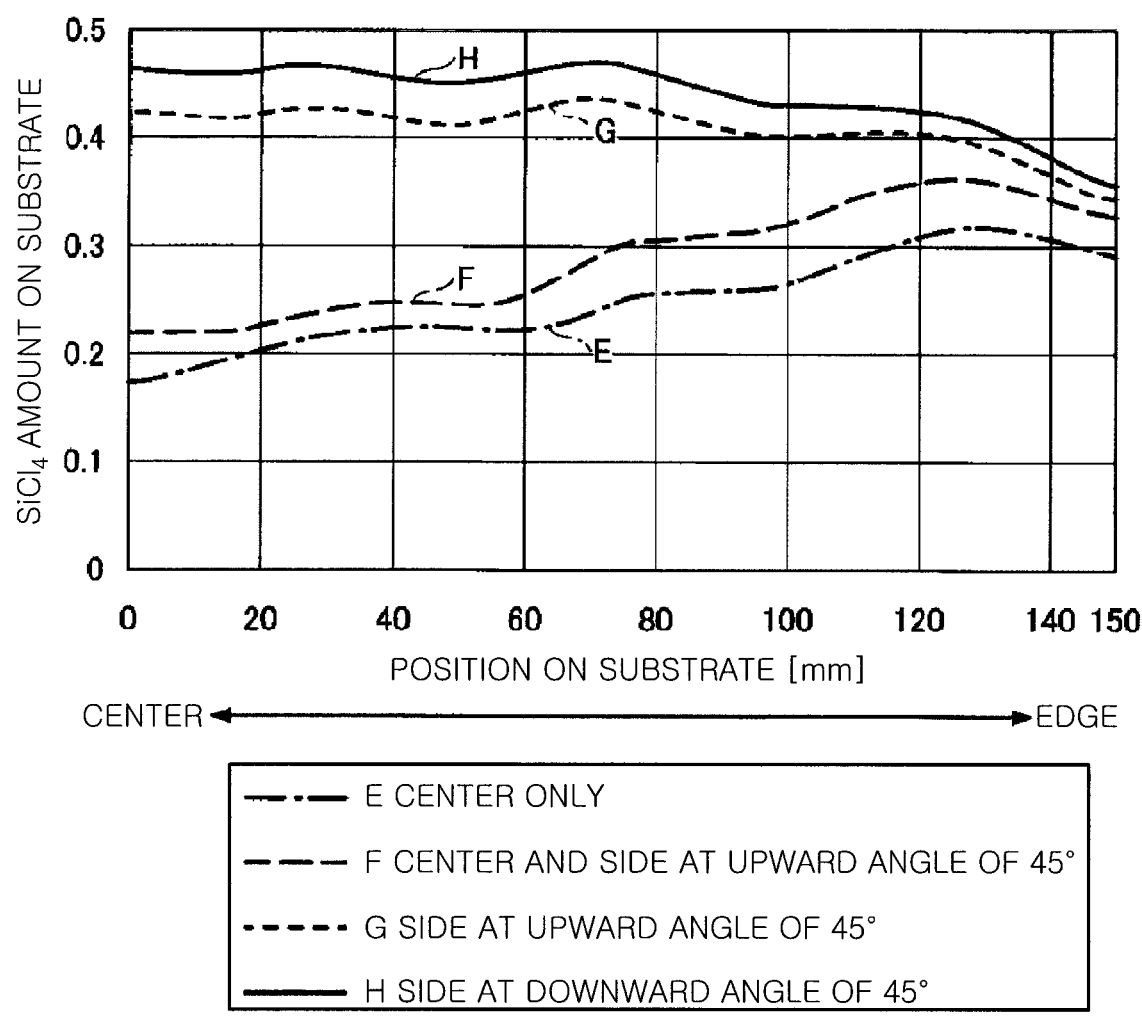
FIG. 9 shows a correlation between a gas inlet angle using a side gas injector and a center injector according to one embodiment and a deposition amount of reaction by-products on a substrate.

Next, a result of a simulation (referred to as "simulation 3") of a deposition state of reaction by-products on the substrate W in the case of introducing a gas through the side gas injector 60 and the center gas injector 41 will be described with reference to FIG. 9. FIG. 9 shows a correlation between gas inlet angles of the side gas injector 60 and the center gas injector 41 according to the embodiment and the deposition amount of reaction by-products on the substrate. The conditions of the simulation 3 are as follows:

(Simulation Conditions)

A pressure in the chamber is 400 mT (53.3 Pa)

The side gas injector and/or the center gas injector introduces Ar gas of 500 sccm $SiCl_4$ of 50 sccm is introduced to simulate the reaction by-products on the substrate.

The horizontal axis of FIG. 9 represents a radial position of the substrate. 0 mm indicates the center of the substrate, and 150 mm indicates the edge of the substrate. The vertical axis of FIG. 9 represents the amount of reaction by-products ($SiCl_4$) deposited on the substrate at each position. $SiCl_4$ is an example of the reaction by-products generated in the case of performing the etching in the plasma processing apparatus 10.

A line E in FIG. 9 indicates the deposition amount of the reaction by-products in the case of introducing Ar gas of 500 sccm downward from the center gas injector 41. At this time, no gas is supplied from the side gas injector 60.

A line F in FIG. 9 indicates the deposition amount of reaction by-products in the case of introducing Ar gas downward from the center gas injector 41 and at an upward angle of 45° from the first side gas injectors 61. Here, the Ar gas is introduced at a total flow of 500 sccm with a flow ratio of 1:1.

The line G in FIG. 9 indicates the deposition amount of the reaction by-products in the case of introducing Ar gas of 500 sccm from the first side gas injectors 61 at an upward angle of 45°. At this time, no gas is supplied from the center gas injector 41.

A line H in FIG. 9 indicates the deposition amount of the reaction by-products in the case of introducing Ar gas of 500 sccm from the second side gas injectors 62 at a downward angle of 45°. At this time, no gas is supplied from the center gas injector 41.

According to the result of the simulation 3, in the case of the line H (introducing a gas at a downward angle from the second side gas injectors 62), the deposition amount of the reaction by-products on the substrate W at the central side of the substrate W is the largest. In the case of the line G (introducing a gas at an upward angle from the first side gas injectors 61), the deposition amount of the reaction by-products on the substrate W at the central side of the substrate W is the second largest.

Next, the deposition amount of the reaction by-products is decreased in the order of the case of the line F (introducing a gas from the center gas injector 41 and the first side gas injectors 61) and the case of the line E (introducing a gas from the center gas injector 41).

From the above results, it is clear that the deposition amount of the reaction by-products on the substrate can be controlled by changing the flow ratio between the center gas injector 41 and the side gas injector 60.

In such a manner, the control range can be expanded by combining the control of the side gas injector 60 and the control of the center gas injector 41.

As described above, in accordance with the plasma processing apparatus 10 of the embodiment, the first side gas injectors 61 and the second side gas injectors 62 are arranged on the sidewall 11a of the chamber 11. Then, the direction of the gas introduced from the first side gas injectors 61 (first direction) and the direction of the gas introduced from the second side gas injectors 62 (second direction) are controlled to be different. Accordingly, it is possible to effectively perform a process control for an etching rate, the deposition amount of reaction by-products, a film forming rate, and the like.

For example, one side gas injector 60 (e.g., the second side gas injectors 62) may introduce a gas toward the edge of the substrate W or toward the edge ring 24 to suppress variation in the distribution of the gas on the substrate. Accordingly, it is possible to supply a large amount of a reactant gas to the edge of the substrate W and to suppress the non-uniform etching rate between the edge region and the central region of the substrate W.

Further, the other side gas injector 60 (e.g., the first side gas injectors 61) may introduce a gas toward the ceiling wall. Therefore, a gas flow directed from the central side toward the edge side of the substrate W is formed and the reaction by-products can be effectively discharged. In this manner, the gas inlet angle of the side gas injector 60 may be set to an arbitrary angle and the side gas injector 60 may be installed at an arbitrary height depending on the purpose. Alternatively, the side gas injector 60 may be provided with a rotating mechanism to be described later to set the gas inlet angle of the side gas injector 60 to any angle during the process.

Further, the gas flow in the chamber 11 can be changed by switching gases supplied to the first side gas injectors 61 and the second side gas injectors 62 or controlling the flow ratio supplied to the first side gas injectors 61 and the second side gas injectors 62. Accordingly, more effective process control or discharge control of reaction by-products can be performed.

For example, the gas may be injected from the first side gas injectors 61 and the second side gas injectors 62 while being pressurized by the corresponding regulators (REG) 63a and 63b, or the gas may be introduced at a reduced flow rate. Accordingly, the gas switching in the chamber 11 can be performed quickly. The gas may be introduced at a predetermined angle while the supply and the shut-off of the supply of the gas are switched by turning on or off the valves 64a and 64b. The gas may be introduced from the first inlet port 61a and the second inlet port 62a at predetermined angles and predetermined pressures while the valves 64a and 64b may be turned on to allow the regulators 63a and 63b to control the gas pressure. In the embodiment, the flow splitter 48 divides the flow rate of the gas flowing through the first side gas injectors 61 and the second side gas injectors 62 to switch gases and/or to pressurize a gas. Therefore, the flow splitter 48 can change a ratio for gas flow division. Further, in the case of using a pressure control type flow splitter, it is possible to perform the control of the ratio for gas flow division together with the control of the gas pressure.

First Modification (Plasma Processing Apparatus)

Figure 10:
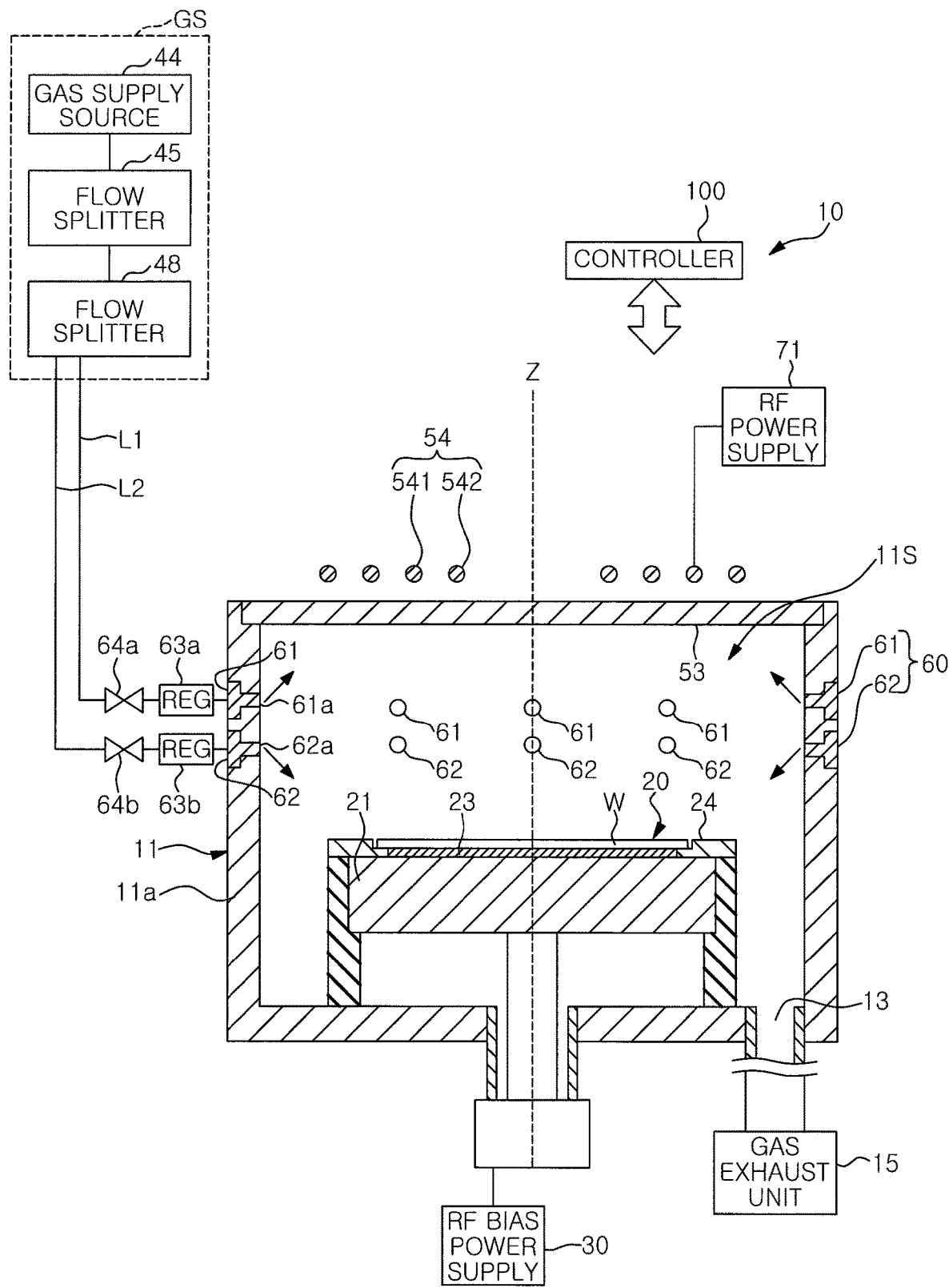
FIG. 10 is a schematic cross-sectional view of a plasma processing apparatus according to a first modification.

Next, a plasma processing apparatus 10 according to a first modification will be described with reference to FIG. 10. FIG. 10 is a schematic cross-sectional view of a plasma processing apparatus 10 according to the first modification. The plasma processing apparatus 10 according to the first modification is different from the plasma processing apparatus 10 (see FIG. 1) according to the first embodiment in that the first side gas inlet line L1 and the second side gas inlet line L2 have a plurality of regulators 63a and a plurality of regulators 63b, respectively. The other configurations of the plasma processing apparatus 10 according to the first modification are the same as those of the plasma processing apparatus 10 according to the first embodiment. Therefore, in the following description, only the different configurations will be described, and the description of the same configurations as those of the first embodiment will be omitted. The plasma processing apparatus according to the first modification may include the center gas injector 41 of the plasma processing apparatus 10 (see FIG. 8) according to the second embodiment.

The first side gas inlet line L1 has the regulators 63a corresponding to the first side gas injectors 61, respectively. The regulators 63a are examples of a plurality of first regulators disposed in the first side gas inlet line L1 to correspond to the first side gas injectors 61, respectively.

In the first modification, the first side gas inlet line L1 may be connected to the first side gas injectors 61 disposed at a tip end thereof, the regulators 63a, and the valve 64a in that order. However, the regulators 63a may be disposed between the valve 64a and the flow splitter 48.

In other words, each of the regulators 63a is connected between the corresponding first side gas injector 61 and the flow splitter 48 and is configured to introduce a pressurized gas from the corresponding first side gas injector 61 to the plasma processing space 11s.

The second side gas inlet line L2 has the regulators 63b corresponding to the second side gas injectors 62, respectively. The regulators 63b are examples of a plurality of second regulators disposed in the second side gas inlet line L2 to correspond to the second side gas injectors 62, respectively.

In the first modification, the second side gas inlet line L2 may be connected to the second side gas injectors 62 disposed at a tip end thereof, the regulators 63b, and a valve 64b in that order. However, the regulators 63b may be disposed between the valve 64b and the flow splitter 48.

In other words, each of the regulators 63b is connected between the corresponding second side gas injector 62 and the flow splitter 48 and is configured to introduce a pressurized gas from the corresponding second side gas injector 62 into the plasma processing space 11s.

(Simulation 4: High-Speed Gas Switching Using a Regulator)

Figure 11A:
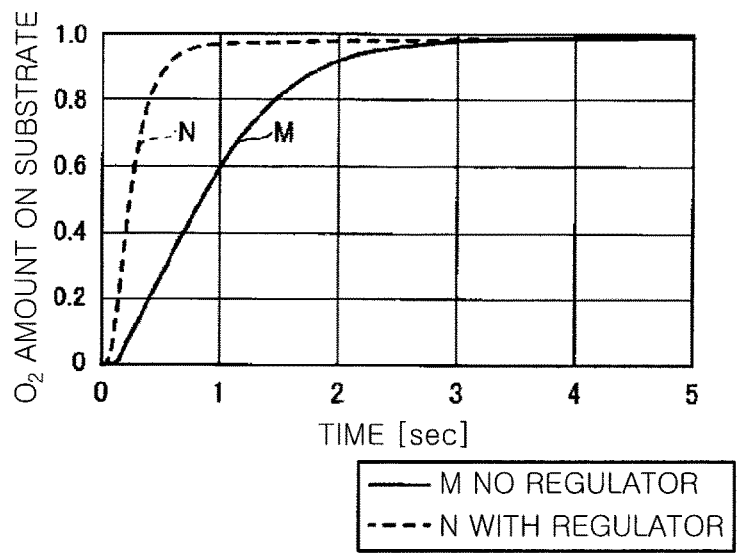
FIGS. 11A to 11C show the presence/absence of a regulator and a gas switching timing according to one embodiment.
Figure 11B:
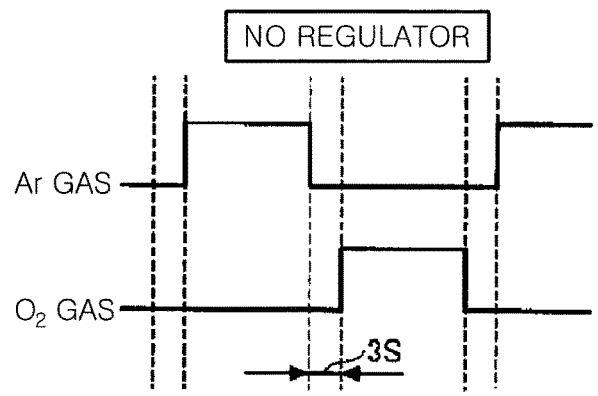
Figure 11C:
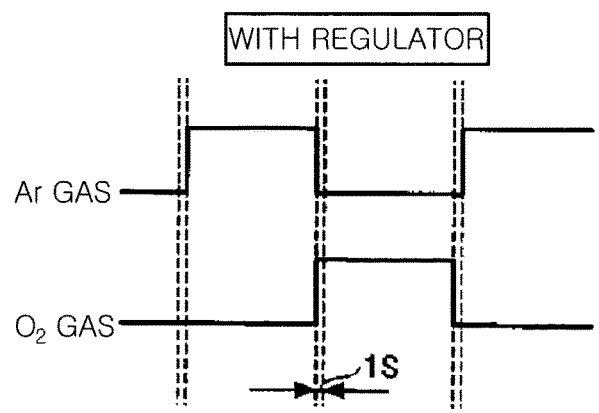

Finally, a result of a simulation (referred to as "simulation 4") of a comparison between the presence/absence of a regulator and a gas switching time will be described with reference to FIGS. 11A to 11C. FIGS. 11A to 11C show the presence/absence of the regulator and the gas switching timing according to the embodiment.

In a specific process such as atomic layer deposition (ALD) or atomic layer etching (ALE) in which gas species are quickly changed, it is significant to shorten the gas switching time and to increase the throughput. Therefore, in the plasma processing apparatus 10 according to the first modification, the regulators 63a are provided to correspond to the first side gas injectors 61, respectively. Further, the regulators 63b are provided to correspond to the second side gas injectors 62, respectively.

Then, a gas is pressurized by the regulators 63a and injected from the first side gas injectors 61 and a gas is pressurized by the regulators 63b and injected from the second side gas injectors 62.

In the simulation 4, Ar gas is supplied from the first side gas injectors 61 and, then, the supply of Ar gas from the first side gas injectors 61 is stopped. Next, $O_2$ gas is supplied from the second side gas injectors 62 and, then, the supply of $O_2$ gas from the second side gas injectors 62 is stopped.

In the case of switching Ar gas to $O_2$ gas, a line M in FIG. 11A indicates the amount of $O_2$ gas on the substrate when the regulators 63a and 63b are not provided, and a line N in FIG. 11A indicates the amount of $O_2$ gas on the substrate when the regulators 63a and 63b are provided.

In the case of the line N where the regulators 63a and 63b are provided, the amount of $O_2$ gas on the substrate is increased quickly compared to the case of line M where the regulators 63a and 63b are not provided. In other words, the switching time from Ar gas to $O_2$ gas is shortened in the case of the line N where the regulators 63a and 63b are provided compared to the case of the line M where the regulators 63a and 63b are not provided.

FIG. 11B shows the timing of switching from Ar gas to $O_2$ gas on the substrate when the regulators 63a and 63b are not provided. FIG. 11C shows the timing of switching from Ar gas to $O_2$ gas on the substrate when the regulators 63a and 63b are provided.

When the regulators 63a and 63b are not provided (FIG. 11B), about 3 seconds is required from the shut-off of the supply of Ar gas to the stabilization of the amount of $O_2$ on the substrate. On the other hand, when the regulators 63a and 63b are provided, as shown in FIG. 11C, about 1 second is required until the amount of $O_2$ on the substrate becomes stable because a gas, which is pressurized to a pressure about twice higher than that of the case where the regulators 63a and 63b are not provided as shown in FIG. 11B, is introduced. Accordingly, the switching time from Ar gas to $O_2$ gas can be shortened by about 70%. From the above, it is clear that the gas switching time can be significantly shortened by providing the regulators 63a and 63b.

Here, one of Ar gas and $O_2$ gas may be introduced from one between the first side gas injectors 61 or the second side gas injectors 62. Further, the other one of Ar gas and gas may be introduced from the other one between the first side gas injectors 61 and the second side gas injectors 62.

Further, Ar gas may be introduced from the center gas injector 41 and, then, the $O_2$ gas may be introduced from the side gas injector 60. By using the first side gas injectors 61, the second side gas injectors 62, and the center gas injector 41, it is possible to effectively introduce each of gas species at desired angles.

Second Modification (Plasma Processing Apparatus)

Figure 12:
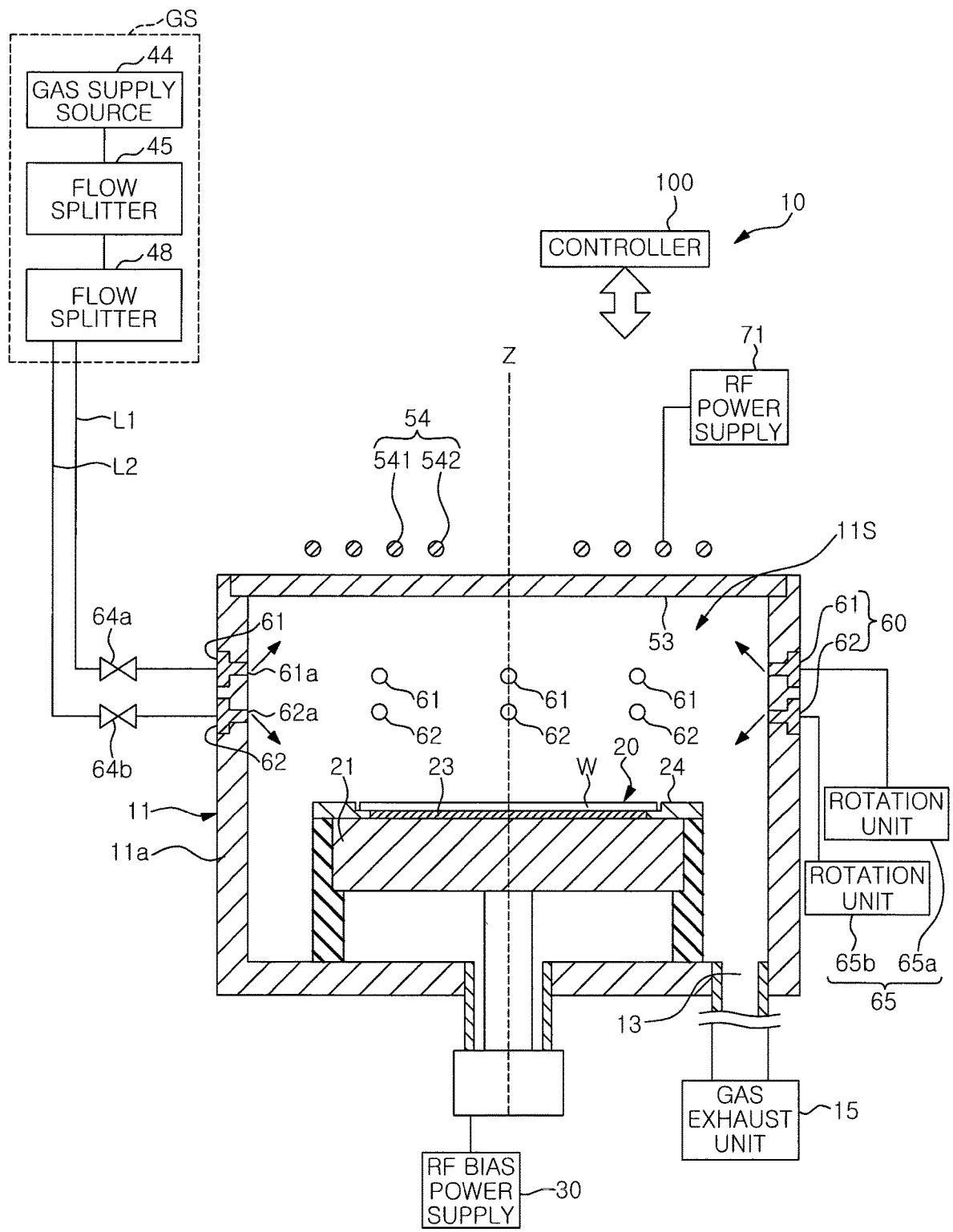
FIG. 12 is a schematic cross-sectional view of a plasma processing apparatus according to a second modification.

Next, a plasma processing apparatus 10 according to a second modification will be described with reference to FIG. 12. FIG. 12 is a schematic cross-sectional view of the plasma processing apparatus 10 according to the second modification. The plasma processing apparatus 10 according to the second modification is different from the plasma processing apparatus 10 (see FIG. 1) according to the first embodiment in that it includes a rotating mechanism 65 configured to rotate the side gas injector 60. The other configurations of the plasma processing apparatus 10 according to the second modification are the same as those of the plasma processing apparatus 10 according to the first embodiment. Therefore, in the following description, only the different configurations will be described, and the description of the same configurations as those of the first embodiment will be omitted. The plasma processing apparatus 10 according to the second modification may include the center gas injector 41 of the plasma processing apparatus 10 (see FIG. 8) according to the second embodiment.

As shown in FIGS. 2A and 2B, each of the first side gas injectors 61 is formed in a substantially cylindrical shape with the central axis AX1 and has the first inlet port 61a having a first angle with respect to the central axis AX1. Further, each of the second side gas injectors 62 is formed in a substantially cylindrical shape with the central axis AX2 and has the second inlet port 62a having a second angle with respect to the central axis AX2.

Referring back to FIG. 12, the plasma processing apparatus 10 includes the rotation mechanism 65, and the rotation mechanism 65 includes a first rotation unit 65a and a second rotation unit 65b. The first rotation unit 65a is configured to rotate each of the first side gas injectors 61 about the central axis AX1. The second rotation unit 65b is configured to rotate each of the second side gas injectors about the central axis AX2. Therefore, the gas inlet angles can be dynamically changed during the substrate processing. Accordingly, the degree of freedom of the gas control in the chamber can be improved.

As described above, in accordance with the plasma processing apparatus of the embodiments and the modifications, a gas(s) can be introduced from the sidewall 11a of the chamber 11 into the plasma processing space 11s at different angles. This makes it possible to effectively perform a process control for an etching rate, the deposition amount of reaction by-products, a film forming rate, and the like. Further, the discharge control of the reaction by-products can be effectively performed.

The presently disclosed plasma processing apparatus is considered in all respects to be illustrative and not restrictive. Further, the above-described embodiments may be variously changed and modified without departing from the scope of the appended claims and the gist thereof. The above-described embodiments may include other configurations without contradicting each other and may be combined without contradicting each other.

The plasma processing apparatus of the embodiments of the present disclosure may be applied to any type of apparatus using an atomic layer deposition (ALD), capacitively coupled plasma (CCP), inductively coupled plasma (ICP), a radial line slot antenna (RLSA), electron cyclotron resonance (ECR) plasma, and helicon wave plasma (HWP). The plasma processing apparatus may be any apparatus for performing plasma processing such as film formation or etching on the substrate. Therefore, the plasma processing apparatus of the embodiments of the present disclosure can be applied to an apparatus including a chamber having a plasma processing space, a substrate support disposed in the plasma processing space, and a plasma generation unit configured to generate plasma from a gas supplied to the plasma processing space.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A plasma processing apparatus comprising:
a chamber having a sidewall and a plasma processing space surrounded by the sidewall;
a first side gas inlet line and a second side gas inlet line configured to introduce at least one gas from the sidewall into the plasma processing space; and
a gas supply unit in fluid communication with the first side gas inlet line and the second side gas inlet line,
wherein the first side gas inlet line includes a plurality of first side gas injectors symmetrically arranged along a circumferential direction on the sidewall and configured to introduce the gas in a first direction into the plasma processing space, and
the second side gas inlet line includes a plurality of second side gas injectors symmetrically arranged along the circumferential direction on the sidewall and configured to introduce the gas in a second direction different from the first direction into the plasma processing space,
wherein the first direction is an obliquely upward direction and the second direction is an obliquely downward direction,
wherein the gas supply unit includes a first flow distributor configured to control a flow ratio of the gas supplied to the first side gas inlet line and the second side gas inlet line,
wherein the first side gas inlet line includes a plurality of first regulators respectively corresponding to the first side gas injectors, each of the first regulators being connected between a corresponding first side gas injector and the first flow distributor and configured to introduce a pressurized gas into the plasma processing space from the corresponding first side gas injector, and the second side gas inlet line includes a plurality of second regulators respectively corresponding to the second side gas injectors, each of the second regulators being connected between a corresponding second side gas injector and the first flow distributor and configured to introduce a pressurized gas into the plasma processing space from the corresponding second side gas injector.

2. The plasma processing apparatus of claim 1, further comprising:
a substrate support disposed in the plasma processing space,
wherein the second direction is directed toward an edge region of the substrate support.

3. The plasma processing apparatus of claim 1, wherein the first direction has an upward angle of 45° with respect to a horizontal plane, and the second direction has a downward angle of 45° with respect to the horizontal plane.

4. The plasma processing apparatus of claim 1, wherein the number of the first side gas injectors is the same as the number of the second side gas injectors, and the first side gas injectors are arranged at different heights from the second side gas injectors.

5. The plasma processing apparatus of claim 1, wherein the number of the first side gas injectors is the same as the number of the second side gas injectors, and the first side gas injectors and the second side gas injectors are arranged at the same height.

6. The plasma processing apparatus of claim 1, wherein the first side gas injectors and the second side gas injectors are alternately arranged along the circumferential direction on the sidewall.

7. The plasma processing apparatus of claim 1, further comprising:
a center gas injector disposed at a center of a ceiling wall of the chamber,
wherein the center gas injector is connected to the gas supply unit, and
the gas supply unit further includes a second flow distributor configured to control a flow ratio of the gas supplied to the center gas injector and the first flow distributor.

8. A plasma processing apparatus comprising:
a chamber having a sidewall and a plasma processing space surrounded by the sidewall;
a first side gas inlet line and a second side gas inlet line configured to introduce at least one gas from the sidewall into the plasma processing space; and
a gas supply unit in fluid communication with the first side gas inlet line and the second side gas inlet line,
wherein the first side gas inlet line includes a plurality of first side gas injectors symmetrically arranged along a circumferential direction on the sidewall and configured to introduce the gas in a first direction into the plasma processing space, and
the second side gas inlet line includes a plurality of second side gas injectors symmetrically arranged along the circumferential direction on the sidewall and configured to introduce the gas in a second direction different from the first direction into the plasma processing space,
wherein the first direction is an obliquely upward direction and the second direction is an obliquely downward direction,
wherein the gas supply unit includes a first flow distributor configured to selectively introduce the gas into the first side gas inlet line or the second side gas inlet line, wherein the first side gas inlet line includes a plurality of first regulators respectively corresponding to the first side gas injectors, each of the first regulators being connected between a corresponding first side gas injector and the first flow distributor and configured to introduce a pressurized gas into the plasma processing space from the corresponding first side gas injector, and the second side gas inlet line includes a plurality of second regulators respectively corresponding to the second side gas injectors, each of the second regulators being connected between a corresponding second side gas injector and the first flow distributor and configured to introduce a pressurized gas into the plasma processing space from the corresponding second side gas injector.

9. The plasma processing apparatus of claim 8, further comprising:
a center gas injector disposed at a center of a ceiling wall of the chamber,
wherein the center gas injector is connected to the gas supply unit, and
the gas supply unit further includes a second flow distributor configured to control a flow ratio of the gas supplied to the center gas injector and the first flow distributor.

10. A plasma processing apparatus comprising:
a chamber having a sidewall and a plasma processing space surrounded by the sidewall; and
a first side gas inlet line and a second side gas inlet line configured to introduce at least one gas from the sidewall into the plasma processing space,
wherein the first side gas inlet line includes a plurality of first side gas injectors symmetrically arranged along a circumferential direction on the sidewall and configured to introduce the gas in a first direction into the plasma processing space, and
the second side gas inlet line includes a plurality of second side gas injectors symmetrically arranged along the circumferential direction on the sidewall and configured to introduce the gas in a second direction different from the first direction into the plasma processing space,
wherein the first direction is an obliquely upward direction and the second direction is an obliquely downward direction,
wherein the first side gas inlet line includes a plurality of bifurcated branch lines,
wherein the bifurcated branch lines includes:
a first bifurcated branch line including one inlet and two outlets, the one inlet being connected to an inlet of the first side gas inlet line;
two second bifurcated branch lines including two inlets and four outlets, the two inlets being respectively connected to the two outlets of the first bifurcated branch line; and
four third bifurcated branch lines including four inlets and eight outlets, the four inlets being respectively connected to the four outlets of the two second bifurcated branch lines and the eight outlets being respectively connected to the first side gas injectors,
wherein respective distances from the one inlet of the first bifurcated branch line to the eight outlets of the four third bifurcated branch lines are the same.

11. The plasma processing apparatus of claim 10, wherein each of the first side gas injectors is formed in a substantially cylindrical shape with a central axis and has a first inlet having a first angle with respect to the central axis, and
each of the second side gas injectors is formed in a substantially cylindrical shape with a central axis and has a second inlet having a second angle with respect to the central axis.

12. The plasma processing apparatus of claim 11, further comprising:
a first rotation unit configured to rotate each of the first side gas injectors about the central axis; and
a second rotating unit configured to rotate each of the second side gas injectors about the central axis.

* * * * *